US007458046B2

(12) United States Patent
Ghosh et al.

(10) Patent No.: US 7,458,046 B2
(45) Date of Patent: Nov. 25, 2008

(54) ESTIMATING THE DIFFICULTY LEVEL OF A FORMAL VERIFICATION PROBLEM

(75) Inventors: Indradeep Ghosh, San Jose, CA (US); Mukul R. Prasad, Sunnyvale, CA (US)

(73) Assignee: Fujitsu Limited, Kawasaki (JP)

( * ) Notice: Subject to any disclaimer, the term of this patent is extended or adjusted under 35 U.S.C. 154(b) by 336 days.

(21) Appl. No.: 11/185,231

(22) Filed: Jul. 19, 2005

(65) Prior Publication Data
US 2007/0022394 A1    Jan. 25, 2007

(51) Int. Cl.
G06F 17/50    (2006.01)
(52) U.S. Cl. .................... 716/5; 716/4; 716/6; 714/738
(58) Field of Classification Search ................ 716/4–6; 714/30, 729, 738, 741
See application file for complete search history.

(56) References Cited

U.S. PATENT DOCUMENTS

| | | | | |
|---|---|---|---|---|
| 5,418,792 | A * | 5/1995 | Maamari ................... | 714/738 |
| 6,496,961 | B2 * | 12/2002 | Gupta et al. .............. | 716/5 |
| 6,567,946 | B1 * | 5/2003 | Nozuyama ................ | 714/741 |
| 6,687,558 | B2 * | 2/2004 | Tuszynski ................. | 700/97 |
| 6,714,902 | B1 * | 3/2004 | Chao et al. ............... | 703/14 |
| 6,738,955 | B2 * | 5/2004 | Andersen et al. .......... | 716/4 |
| 6,782,515 | B2 * | 8/2004 | Scott et al. ............... | 716/4 |
| 6,886,124 | B2 * | 4/2005 | Wang ....................... | 714/738 |
| 7,047,510 | B1 * | 5/2006 | Chopra et al. ............ | 716/7 |
| 7,073,143 | B1 * | 7/2006 | Huang ..................... | 716/5 |
| 7,130,783 | B1 * | 10/2006 | Harer et al. .............. | 703/13 |
| 7,191,374 | B2 * | 3/2007 | Maamari et al. .......... | 714/738 |
| 2003/0225552 | A1 * | 12/2003 | Ganai et al. .............. | 703/2 |
| 2004/0093571 | A1 * | 5/2004 | Jain et al. ................. | 716/5 |
| 2005/0138474 | A1 * | 6/2005 | Jain et al. ................. | 714/30 |
| 2005/0193304 | A1 * | 9/2005 | Abraham et al. .......... | 714/738 |
| 2005/0262456 | A1 * | 11/2005 | Prasad ..................... | 716/4 |
| 2006/0161648 | A1 * | 7/2006 | Ding et al. ................ | 709/224 |
| 2006/0212837 | A1 * | 9/2006 | Prasad ..................... | 716/5 |
| 2006/0236274 | A1 * | 10/2006 | Baumgartner et al. ..... | 716/3 |

(Continued)

FOREIGN PATENT DOCUMENTS

CN    1421013 A    5/2003

(Continued)

OTHER PUBLICATIONS

Nudelman et al.;"SATzilla: An Algorithm Portfolio for SAT"; SAT 2003 Competition, in conjunction with the Sixth International Conference on the Theory and Applications of Satisfiability Testing. pp. 1-2.*

(Continued)

*Primary Examiner*—Jack Chiang
*Assistant Examiner*—Naum Levin
(74) *Attorney, Agent, or Firm*—Baker Botts L.L.P.

(57) ABSTRACT

Estimating the difficulty level of a verification problem includes receiving input comprising a design and properties that may be verified on the design. Verification processes are performed for each property on the design. A property verifiability metric value is established for each property in accordance with the verification processes, where a property verifiability metric value represents a difficulty level of verifying the property on the design. A design verifiability metric value is determined from the property verifiability metric values, where the design verifiability metric value represents a difficulty level of verifying the design.

20 Claims, 2 Drawing Sheets

U.S. PATENT DOCUMENTS

2006/0242515 A1* 10/2006 Alvamani et al. ............ 714/729
2007/0011629 A1* 1/2007 Shacham et al. ................ 716/3

OTHER PUBLICATIONS

Achlioptas et al.; "Generating Satisfiable Problem Instances"; 2000, American Association for Artificial Intelligence (www.aaai.org). pp. 1-6.*

Ghosh et al.; "A BIST Scheme for RTL Circuits Based on Symbolic Testability Analysis"; IEEE Transactions on Computer-Aided Design of Integrated Circuits and Systems, vol. 19, No. 1, Jan. 2000; pp. 111-128.*

Ghosh et al.; "Design for Veri cation at the Register Transfer Level"; Proceedings of the 15th International Conference on VLSI Design; 2002; pp. 420-425.*

Ghosh et al.i On automatic generation of RTL validation test benches using circuit testing techniques:; ACM Great Lakes Symposium on VLSI 2003: 289-294.*

Lawrence H. Goldstein, et al., "SCOAP: Sandia Controllability/Observability Analysis Program", Sandia National Laboratories, pp. 190-196.

Robert K. Brayton, et al., "VIS: A System for Verification and Synthesis", 4 pages.

Vamsi Boppana, et al., "Model Checking Based on Sequential ATPG", Fujitsu Laboratories of America, Inc., Sunnyvale, California, 13 pages.

Edmund Clarke, et al., "Bounded Model Checking Using Satisfiability Solving", pp. 1-20.

Indradeep Ghosh, et al., "Design for Verification at the Register Transfer Level", 6 pages.

K. L. McMillan, et al., "Automatic Abstraction without Counterexamples", © 2002 Cadence Berkeley Labs, Cadence Design Systems, pp. 1-21.

Jacob A. Abraham, et al., "Verifying Properties Using Sequential ATPG", 9 pages.

Aarti Gupta, et al., "Iterative Abstraction using SAT-based BMC with Proof Analysis", ICCAD '03, Copyright 2003, ACM 1-58113-762-1/03/0011, pp. 416-423.

Fan, Yong, et al., "An Improved Weighted Average Algorithm for Calculating Signal Probability of Combinational Circuit", Journal of Electronic Measurement and Instrument, vol. 9, No. 1, English translation of the abstract only, 5 pages.

Communication from The State Intellectual Property Office of China, First Notification of Office Action transmitted to Baker Botts via facsimile Dec. 29, 2007, for Application No. 2006101059436, 12 pages.

M. K. Iyer, et al., "Satori—A Fast Sequential SAT Engine For Circuits", ICCAD '03, Copyright 2003, ACM 1-58113-762-1/03/001, pp. 320-325, Nov. 11-13, 2003.

Peter C. Mehlitz, et al., "Design for Verification Using Design Patterns to Build Reliable Systems", 6 pages, 2003.

Christian Stangier, et al., "Invariant Checking Combining Forward and Backward Traversal", Fujitsu Labs of America, Inc., 15 pages, 2004.

* cited by examiner

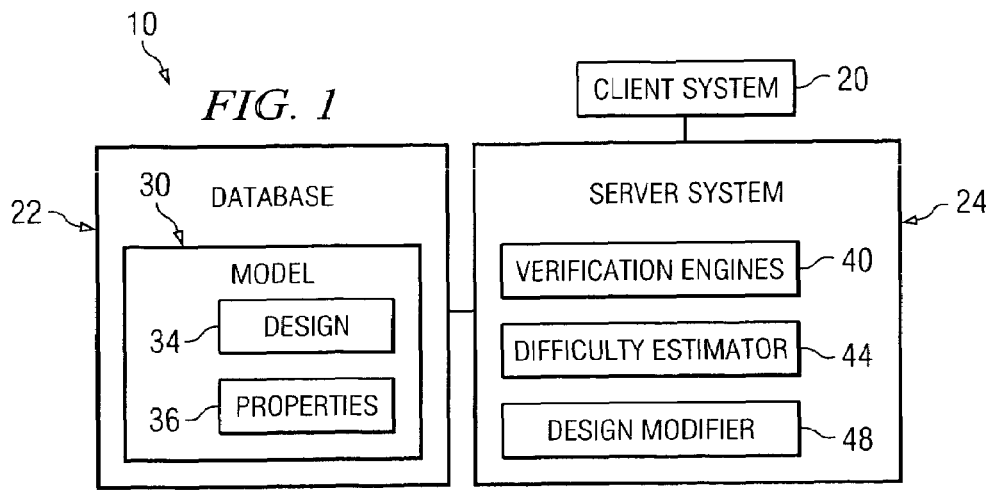

| LEVEL | $L_1$ | $L_2$ | $L_3$ | $L_4$ | $L_5$ | $L_6$ |
|---|---|---|---|---|---|---|
| NAME | TRIVIAL | EASY | MODERATE | HARD | VERY HARD | UNDECIDED |
| APPROXIMATE TIME | ≈0-60 SECONDS | ≈1-30 MINUTES | ≈31-60 MINUTES | ≈1-24 HOURS | > 1 DAY | |

FIG. 4

| FINAL SIZE [FFs] \ ABS | <25% | 25%-50% | 50%-75% | >75% |
|---|---|---|---|---|
| <50 | EASY/ TRIVIAL | TRIVIAL | TRIVIAL | TRIVIAL |
| 50-150 | HARD/ MODERATE | HARD/ MODERATE | MODERATE/ EASY | EASY/ TRIVIAL |
| 150-300 | VERY HARD/ HARD | VERY HARD/ HARD | HARD/ MODERATE | MODERATE/ EASY |
| BUFFER ZONE | UNDECIDED | UNDECIDED | UNDECIDED | UNDECIDED |
| >500 | VERY HARD | VERY HARD | VERY HARD | VERY HARD/ HARD |

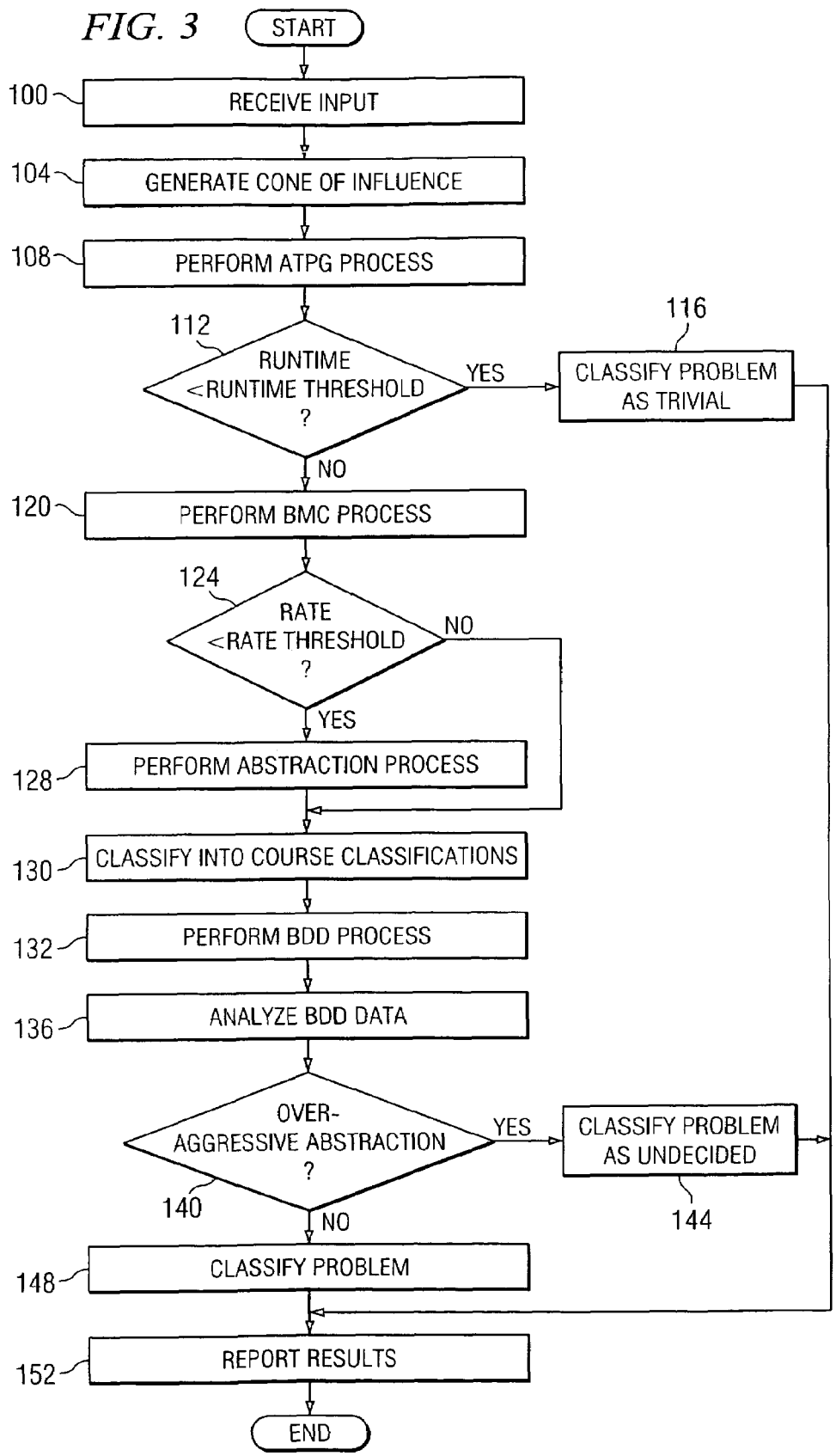

ESTIMATING THE DIFFICULTY LEVEL OF A FORMAL VERIFICATION PROBLEM

TECHNICAL FIELD

This invention relates generally to the field of integrated circuit design and more specifically to estimating the difficulty level of a formal verification problem.

BACKGROUND

Advances in circuit technology have provided for the placement of significantly more transistors on an integrated circuit, which requires more complicated circuit design. Known techniques for evaluating circuit design, however, are typically inefficient when faced with the more complicated circuit designs. Consequently, known techniques for evaluating circuit design may be unsatisfactory in certain situations.

SUMMARY OF THE DISCLOSURE

In accordance with the present invention, disadvantages and problems associated with previous techniques for estimating the difficulty level of a formal verification problem may be reduced or eliminated.

According to one embodiment, estimating the difficulty level of a verification problem includes receiving input comprising a design and properties that may be verified on the design. Verification processes are performed for each property on the design. A property verifiability metric value is established for each property in accordance with the verification processes, where a property verifiability metric value represents a difficulty level of verifying the property on the design. A design verifiability metric value is determined from the property verifiability metric values, where the design verifiability metric value represents a difficulty level of verifying the design.

Certain embodiments of the invention may provide one or more technical advantages. A technical advantage of one embodiment may be that a difficulty level for verifying a circuit is established. A difficulty level for verifying a property on the circuit is determined for each property of a set of properties. The difficulty level for verifying the circuit is established from the difficulty levels of the properties. The difficulty level for the circuit may be used to estimate the amount of resources needed to verify the circuit, to design a verification methodology, to adjust the verification engine parameters, to modify the circuit design for verification, or to perform any other suitable purpose.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 1 is a block diagram of one embodiment of a system for estimating the difficulty level of a formal verification problem;

FIG. 2 is a table illustrating an example set of difficulty levels;

FIG. 3 is a flowchart of one embodiment of a method for estimating the difficulty level of verifying a property on a circuit; and FIG. 4 is a table illustrating an example rough classification according to abstractability and the final size of the abstracted circuit.

DETAILED DESCRIPTION OF THE DRAWINGS

Embodiments of the present invention and its advantages are best understood by referring to FIGS. 1 through 4 of the drawings, like numerals being used for like and corresponding parts of the various drawings.

FIG. 1 is a block diagram of one embodiment of a system 10 for estimating the difficulty level of a formal verification problem. According to the embodiment, system 10 establishes a difficulty level for verifying a circuit. A difficulty level for verifying a property on the circuit is determined for each property of a set of properties. The difficulty level for verifying the circuit may be established from the difficulty levels of the properties.

In general, a specification of a circuit describes the intended behavior of the circuit, and a design of the circuit describes the arithmetic and logical operations designed to carry out the intended behavior. The specification and the design may be represented by mathematical models. The mathematical models may be compared according to a formal verification process to establish whether the design carries out the intended behavior described by the specification. Performing the comparison, however, is typically difficult. Moreover, in certain cases the verification process may never reach completion.

System 10 estimates the difficulty level of a formal verification problem. According to one embodiment, a difficulty level may reflect the amount of resources needed to perform a verification problem. Resources may include, for example, computational time or memory or both computational time and memory. In general, a higher difficulty level indicates more resources, where a lower difficulty level indicates fewer resources. By estimating the difficulty level, verification methodologies may be devised or formal verification problems may be adjusted before running the full verification process.

According to the illustrated embodiment, system 10 includes a client system 20, a database 22, and a server system 24 coupled as shown in FIG. 1. According to one embodiment, client system 20 allows a user to communicate with server system 24 to estimate the difficulty level of a formal verification problem.

Database 22 stores data that may be used by server system 24. According to the illustrated embodiment, database 22 stores a model 30 under verification. Model 30 represents the model that is being analyzed by system 10. Model 30 includes a design 34 under verification and properties 36. Design 34 may represent any suitable design that may be verified, such as a circuit design. A circuit design may comprise a register-transfer level (RTL) circuit design of any suitable size, such as up to 20,000 latches and up to 30,000 gates. Design 34 may be expressed in, for example, Very High Speed Integrated Circuits (VHSIC) Hardware Description Language (VHDL) or VERILOG, which may be used in the process of designing a circuit.

Design 34, however, may represent any suitable design. As an example, design 34 may represent a specification level or a system level circuit design. As another example, design 34 may represent a software design instead of a circuit design.

A property 36 may represent a feature of design 34 that may be verified. According to one embodiment, a feature generally describes a behavior of the circuit under specified conditions. Example properties 36 may include properties associated with industrial or academic benchmark designs, such as properties included with the Visual Interacting with Synthesis (VIS) benchmark set. A property may be used to capture the evolution of system behavior over time, or a property may represent a time invariant system characteristic.

Server system 24 manages applications that may be used to estimate the difficulty level of a formal verification problem. According to the illustrated embodiment, server system 24 includes verification engines 40, a difficulty estimator 44, and a design modifier 48.

Verification engines 40 may represent software-encoded engines operable to perform verification processes. A verification process may refer to a process that verifies a property on a design, and may include formal and informal verification process. Example verification processes may include, for example, an automatic test pattern generation (ATPG) process, a satisfiability-based bounded model checking (SAT BMC) process, a symbolic model checking process based on binary decision diagrams (BDDs), a simulation process, other suitable verification process, or any combination of the preceding.

Difficulty estimator 44 may operate to estimate the difficulty level of a verification problem. According to one embodiment, difficulty estimator 44 may calculate a verifiability metric that may be used to estimate the difficulty level of a verification problem. Difficulty estimator 44 may operate according to any suitable technique for estimating the difficulty level. An example of a method is described with reference to FIG. 2.

According to one embodiment, verification engines 40 and difficulty estimator 44 may cooperate to establish a verification methodology or verification parameters for verification engines 40. A verification parameter may refer to a parameter of a verification engine, and may include time out, effort, depth, other parameter, or any suitable combination of the preceding.

According to the embodiment, verification engines 40 may perform sample runs for a verification problem and communicate the results to difficulty estimator 44. Difficulty estimator 44 may calculate verifiability metrics from the sample runs. The verifiability metrics may indicate how verification parameters may be changed in order to decrease the difficulty level. As an example, a timeout value for a verification engine 40 may be increased if the difficulty level for a problem is high. As another example, verification parameters may be changed to select a particular set of or a particular sequence of verification engines 40 that use fewer resources over verification engines 40 that use more resources.

Design modifier 48 may be used to modify design 34 in response to results from difficulty estimator 44. Design 34 may be modified to decrease the difficulty level of design 34. According to one embodiment, design modifier 48 may allow a user to modify design 34 in response to results from system 10. According to another embodiment, design modifier 48 may automatically modify design 34 in response to the results from system 10. The modifications need not be required to be in the final circuit design. As an example, the modifications may be made only to verify the circuit design, and may be removed for actual production of the circuit.

According to one embodiment, a verifiability metric may be calculated in the following manner. Model 30 includes design 34 of circuit R and a set 36 of n properties $\{P_1, \ldots, P_n\}$ of circuit R that are to be verified. A property verifiability metric value $V(R, P_i)$ of a property $P_i$ of circuit R represents the difficulty level of verifying property $P_i$ on circuit R. As an example, a higher metric value may indicate a higher difficulty level, while a lower metric value may indicate a lower difficulty level.

According to the embodiment, a passing verifiability metric value and a failing verifiability metric value may be calculated for a property. As an example, a passing verifiability metric value $V_{pass}(R, P_i)$ assumes that property $P_i$ eventually passes, and a failing property verifiability metric value $V_{fail}(R, P_i)$ assumes that property $P_i$ eventually fails.

A design verifiability metric value of design 34 may be calculated to indicate the difficulty level of verifying the set of properties on design 34. As an example, a circuit verifiability metric value $V(R)$ of circuit R may be calculated to indicate the difficulty level of verifying the set of properties on circuit R. The circuit verifiability metric value $V(R)$ may be calculated from the weighted average of the property verifiability metric values $V(R, P_i)$.

According to one embodiment, circuit verifiability metric value $V(R)$ may be calculated from the passing verifiability metric value $V_{pass}(R, P_i)$, since in certain cases the failing verifiability metric value is difficult to estimate. According to the embodiment, circuit verifiability metric value $V(R)$ may be calculated according to Equation (1):

$$V(r) = \frac{1}{n} \sum_{i=1}^{n} w_i V_{pass}(R, P_i) \quad (1)$$

where $w_i$ represents the weight of a property $P_i$. The passing verifiability metric value may be used as an over-approximation of the failing verifiability metric value.

The properties may be weighted in any suitable manner. According to one embodiment, a more important or more critical property may be given a higher weight than that of a less important or less critical property. As an example, a property with a larger cone of influence may be given a higher weight.

A verifiability metric value may be expressed in any suitable manner. As an example, the value may be expressed as a number, a range, or a classification. According to one embodiment, the verifiability metric value is expressed as a classification of a set of m difficulty levels $\{L_1, \ldots, L_m\}$. The number m of difficulty levels may be selected in accordance with a desired computational time and degree of precision level. An example set of difficulty levels is described in more detail with reference to FIG. 2.

FIG. 2 is a table 60 illustrating an example set of difficulty levels. According to the illustrated embodiment, the set includes six difficulty levels $L_1, \ldots, L_6$. The levels are trivial, easy, moderate, hard, very hard, and undecided levels. The approximate time represents an approximation of the time it would take to perform verification on a problem of said difficulty level. The undecided difficulty level indicates that the difficulty level cannot be determined.

Modifications, additions, or omissions may be made to the example set of difficulty levels without departing from the scope of the invention. As an example, a set may have more, fewer, or different difficulty levels. As another example, the approximate times may be different. As another example, the degree of a difficulty level may be expressed in a parameter other than approximate time.

Referring back to FIG. 1, a circuit verifiability metric value may have a confidence value. The confidence value may be assessed in any suitable manner. As an example, a circuit verifiability metric value calculated from a set of properties that provide more coverage for a circuit may be given a higher confidence value than a circuit verifiability metric value calculated from a set that provides less coverage.

One or more components of system 10 may be integrated or separated according to particular needs. For example, the functions of client system 20 and server system 24 may be provided using a single computer system, for example, a single personal computer. If any components are separated, the components may be coupled using one or more local area networks (LANs), metropolitan area networks (MANs), wide area networks (WANs), global computer networks such as the Internet, or other wire line or wireless links.

"Computer" may refer to any suitable device operable to accept input, process the input according to predefined rules, and produce output, for example, a personal computer, work station, network computer, wireless telephone, personal digital assistant, one or more microprocessors within these or other devices, or any other suitable processing device.

One or more components of system 10 may include appropriate input devices, output devices, mass storage media, processors, memory, or other components for receiving, processing, storing, or communicating information according to the operation of system 10. As an example, one or more components of system 10 may include logic, an interface, memory, other component, or any suitable combination of the preceding. "Logic" may refer to hardware, software, other logic, or any suitable combination of the preceding. Certain logic may manage the operation of a device, and may comprise, for example, a processor. "Processor" may refer to any suitable device operable to execute instructions and manipulate data to perform operations.

"Interface" may refer to logic of a device operable to receive input for the device, send output from the device, perform suitable processing of the input or output or both, or any combination of the preceding, and may comprise one or more ports, conversion software, or both. "Memory" may refer to logic operable to store and facilitate retrieval of information, and may comprise Random Access Memory (RAM), Read Only Memory (ROM), a magnetic drive, a disk drive, a Compact Disk (CD) drive, a Digital Video Disk (DVD) drive, removable media storage, any other suitable data storage medium, or a combination of any of the preceding.

Modifications, additions, or omissions may be made to system 10 without departing from the scope of the invention. As an example, although system 10 is described as evaluating circuit design, system 10 may be used to evaluate software. Moreover, the operations of system 10 may be performed by more, fewer, or other modules. Additionally, operations of system 10 may be performed using any suitable logic comprising software, hardware, other logic, or any suitable combination of the preceding. "Each" as used in this document refers to each member of a set or each member of a subset of a set.

FIG. 3 is a flowchart of one embodiment of a method for estimating the difficulty level of verifying a property on a circuit. According to the embodiment, the design represents a circuit with circuit elements such as latches. Structural and functional features of the design are analyzed to estimate a property verifiability metric value for a property. A structural feature may describe the structure of design 34, and a functional feature may describe the operation of design 34. The method may be performed by any suitable system, such as system 10 of FIG. 1.

The method begins at step 100, where input is received. The input may include model 30 comprising design 34 and a property of the set of properties 36. The property may be inserted as a miter into design 34. A logic cone of influence is generated from design 34 at step 104. The logic cone of influence may be generated by synthesizing design 34 to gates, and then extracting the logic cone of influence from the gates.

An automatic test pattern generation (ATPG) process is performed at step 108. An automatic test pattern generation process attempts to justify a series of values at different signals. During the process, immediate local conflicts may be discovered such that analysis of the complete design 34 is not necessary. Accordingly, the result and runtime of the automatic test pattern generation process may indicate a difficulty level.

According to one embodiment, a lower runtime may correspond to a lower difficulty level, and a higher runtime may correspond to a higher difficulty level. According to the illustrated embodiment, a runtime that is less than a runtime threshold may indicate that the problem is trivial. The runtime threshold may have any suitable value selected to identify trivial problems. As an example, the runtime threshold value may be less than five seconds, such as one, two, three, or four seconds.

If the runtime of the automatic test pattern generation process is less than a runtime threshold at step 112, the method proceeds to step 116. The problem is classified as trivial at step 116. The method then proceeds to step 152.

If the runtime is not less than the runtime threshold at step 112, the method proceeds to step 120, where a bounded model checking (BMC) process is performed. The process may be performed for any suitable amount of time, such as 10 to 60 seconds, for example, approximately 20 seconds. A bounded model checking process considers counter-examples of a particular length and tests a propositional formula that is satisfiable if and only if such a counter example exists. Typically, the number of time frames in a bound is progressively increased by a predetermined number, and the problem is solved for a larger number of time frames until a time limit is exceeded. Each step may be increased by any suitable number of time frames, such as 2 to 20 time frames, for example, approximately 10 time frames.

According to one embodiment, the rate of increase in the number of time frames indicates a difficulty level. According to the embodiment, a lower rate may indicate a higher difficulty level, whereas a higher rate may indicate a lower difficulty level. According to the illustrated embodiment, a rate that is less than a rate threshold may indicate a higher difficulty level. The rate threshold may have any suitable value, for example, 10 to 60 time frames per second, such as 20, 30, or 50 time frames per second.

If the rate is less than a rate threshold at step 124, the method proceeds to step 128, where an abstraction process is performed on design 34. An abstraction process appropriately simplifies a circuit to reduce the size of the circuit. As an example, redundant circuit elements such as redundant latches may be removed.

The abstraction process may be performed in any suitable manner. According to one embodiment, the process may be performed using a bounded model checking process. The bounded model checking process may have any suitable bound, such as 20 to 30 frames, for example, 25 frames, and may be run for any suitable time, such as 10 to 60 seconds, for example, approximately 20 seconds.

According to one embodiment, the original circuit includes original circuit elements. Circuit elements are abstracted out from the original circuit to yield an abstracted circuit that has remaining circuit elements. For example, latches that constitute an unsatisfiable core may be retained, and the rest may be abstracted out as primary inputs. The abstractability of a circuit may be expressed as a function of the number of elements abstracted out from the original circuit and the number of the original circuit elements. As an example, the abstractability may be defined as the ratio of the abstracted circuit elements to the original circuit elements.

The abstractability of a circuit and the number of the remaining circuit elements may indicate a difficulty level. For example, a higher abstractability may indicate a lower difficulty level, and a higher number of remaining circuit elements may indicate a higher difficulty level. Accordingly, the abstractability and the number of remaining circuit elements may be used to classify a problem into rough classifications. An example rough classification is described in more detail with reference to FIG. 4.

FIG. 4 is a table 70 illustrating an example rough classification according to the abstractability of a circuit and the final size of the abstracted circuit. According to the example, the abstractability is expressed as the ratio of the number of the abstracted circuit elements to the number of the original circuit elements, and is divided into four categories. The size of the abstracted circuit (FINAL SIZE) is expressed as the number of flip-flops (FFs) of the abstracted circuit, and is divided into five categories.

Modifications, additions, or omissions may be made to the example rough classification without departing from the scope of the invention. As an example, the rough classification may have more, fewer, or different final size or abstractability categories. As another example, the rough classification may have more, fewer, or different classifications.

Referring back to FIG. 3, if the rate is not less than the rate threshold at step 124, the method proceeds directly to step 130. A BDD-based symbolic model checking process is performed at step 132. A BDD-based symbolic model checking process may refer to a process that verifies a state machine encoded as a binary decision diagram. The symbolic model checking process may be run for any suitable time. For example, the process may be run for 10 to 60 seconds with approximately 20 seconds for abstracted circuits and 40 seconds for unabstracted circuits.

The data from the symbolic model checking process is analyzed at step 136. The data may be used to establish whether the abstraction process, if performed, is over-aggressive. If the binary decision diagram steps go deep within a short period of time, the abstraction may be designated as over-aggressive. As an example, an abstraction with binary decision diagram steps that go more that 140, such as more than 150, deep within a period of 15 to 25 seconds, such as approximately 20 seconds, may be designated as over-aggressive. If the abstraction is designated as over-aggressive at step 140, the method proceeds to step 144, where the problem is classified as undecided. The method then proceeds to step 152.

If the abstraction is not designated as over-aggressive at step 140, the method proceeds to step 148. The problem is classified according to the binary decision diagram data at step 148. If the symbolic model checking process is completed within the runtime, the difficulty level may be designated as trivial or easy. Otherwise, other features of the binary decision diagram data may indicate a difficulty level or may be used to refine the classification produced in step 130.

According to one embodiment, the size of the binary decision diagram transition relation may indicate the difficulty level. A smaller transition relation may indicate a lower difficulty level. As an example, a transition relation size of less than 15,000 nodes may have a lower difficulty level. The rate of growth of the binary decision diagram may also indicate the difficulty level. A lower rate may indicate a lower difficulty level. According to one embodiment, the following guidelines may be used to classify the problem according to the BDD data. The classification may be used to refine the classification produced in step 130 to produce a final classification:

1. If the size is greater than 90,000 nodes at 20 seconds, the difficulty level is moderate to very hard.
2. If the size is less than 30,000 nodes at 20 seconds, the difficulty level is trivial to easy.
3. If the size is greater than 160,00 nodes at 40 seconds, the difficulty level is hard to very hard.
4. If the size is less than 100,000 nodes at 40 seconds, the difficulty level is moderate to easy.

The results are reported at step 152. After reporting the results, the method terminates.

Modifications, additions, or omissions may be made to the method without departing from the scope of the invention. The method may include more, fewer, or other steps. Additionally, steps may be performed in any suitable order without departing from the scope of the invention.

The above method applies to passing properties. A similar method may be used for failing properties. The method may include any suitable guideline. As an example, the number of circuit elements may indicate a difficulty level. A larger number of circuit elements may indicate a higher difficulty level. As another example, the depth of a binary decision diagram run may indicate a difficulty level. Deeper binary decision diagram runs may indicate lower difficulty levels. As another example, the rate of the growth of bounded model checking frames may indicate a difficulty level. A higher rate may indicate a lower difficulty level. As a another example, the binary decision diagram transition relation may indicate a difficulty level. A smaller transition relation may indicate a lower difficulty level.

Certain embodiments of the invention may provide one or more technical advantages. A technical advantage of one embodiment may be that a difficulty level for verifying a circuit is established. A difficulty level for verifying a property on the circuit is determined for each property of a set of properties. The difficulty level for verifying the circuit is established from the difficulty levels of the properties. The difficulty level for the circuit may be used to estimate the amount of resources needed to verify the circuit, to design a verification methodology, to adjust verification engine parameters, to modify the circuit design for verification, or to perform any other suitable purpose.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. A method for estimating the difficulty level of a verification problem, comprising:
   receiving input comprising a design and a set of properties, a property of the set of properties operable to be verified on the design;
   repeating the following for each property of the set of properties:

performing a plurality of verification processes on the each property on the design by performing an automatic test pattern generation process on the design; and establishing a property verifiability metric value for the each property in accordance with the verification processes by establishing a lower difficulty level if the runtime of the automatic test pattern generation process is less than a runtime threshold, the property verifiability metric value representing a difficulty level of verifying the each property on the design; and determining a design verifiability metric value from the property verifiability metric values of the set of properties, the design verifiability metric value representing a difficulty level of verifying the set of properties on the design.

2. The method of claim 1, wherein:
the design comprises a circuit design for a circuit; and
the design verifiability metric value comprises a circuit verifiability metric value.

3. The method of claim 1, wherein determining the design verifiability metric value further comprises:
assigning a weight to each property of the set of properties;
calculating a weighted average of the property verifiability metric values, a property verifiability metric value of a property weighted according to the weight assigned to the property; and
generating the design verifiability metric value from the weighted average.

4. The method of claim 1, wherein establishing the property verifiability metric value further comprises:
establishing a passing property verifiability metric value for the property, the passing verifiability metric value representing the difficulty level of verifying the property assuming that the property passes.

5. The method of claim 1, wherein:
performing the plurality of verification processes on the each property on the design further comprises:
performing a symbolic model checking process based on one or more binary decision diagrams on the design; and
establishing the property verifiability metric value further comprises:
calculating a rate of growth of the binary decision diagrams; and
selecting a higher difficulty level if the rate of growth is greater than a rate of growth threshold.

6. The method of claim 1, wherein:
performing the plurality of verification processes on the each property on the design further comprises:
performing a symbolic model checking process based on one or more binary decision diagrams on the design; and
establishing the property verifiability metric value further comprises:
calculating a transition relation size of the binary decision diagrams; and
selecting a lower difficulty level if the transition relation size is lower than a transition relation size threshold.

7. A method for estimating the difficulty level of a verification problem, comprising:
receiving input comprising a design and a set of properties, a property of the set of properties operable to be verified on the design;
repeating the following for each property of the set of properties:
performing a plurality of verification processes on the each property on the design by performing a bounded model checking process on the design;
establishing a property verifiability metric value for the each property in accordance with the verification processes, the property verifiability metric value representing a difficulty level of verifying the each property on the design, establishing the property verifiability metric value comprising:
determining a rate of growth of a plurality of time frames of the bounded model checking process; and
performing an abstraction process on the design if the rate is less than a rate threshold; and
determining a design verifiability metric value from the property verifiability metric values of the set of properties, the design verifiability metric value representing a difficulty level of verifying the set of properties on the design.

8. A method for estimating the difficulty level of a verification problem, comprising:
receiving input comprising a design and a set of properties, a property of the set of properties operable to be verified on the design;
repeating the following for each property of the set of properties:
performing a plurality of verification processes on the each property on the design, performing the plurality of verification processes on the each property on the design comprising:
performing an abstraction process on the design to abstract out a first number of abstracted elements from the design comprising a second number of original elements to yield a third number of remaining elements;
establishing a property verifiability metric value for the each property in accordance with the verification processes, the property verifiability metric value representing a difficulty level of verifying the each property on the design, establishing the property verifiability metric value comprising:
establishing a higher difficulty level if the third number of remaining elements is greater than an remaining element threshold; and
determining a design verifiability metric value from the property verifiability metric values of the set of properties, the design verifiability metric value representing a difficulty level of verifying the set of properties on the design.

9. A method for estimating the difficulty level of a verification problem, comprising:
receiving input comprising a design and a set of properties, a property of the set of properties operable to be verified on the design;
repeating the following for each property of the set of properties:
performing a plurality of verification processes on the each property on the design, performing the plurality of verification processes on the each property on the design comprising:
performing an abstraction process on the design to abstract out a first number of abstracted elements from the design comprising a second number of original elements to yield a third number of remaining elements;
establishing a property verifiability metric value for the each property in accordance with the verification processes, the property verifiability metric value representing a difficulty level of verifying the each property on the design, establishing the property verifiability metric value comprising:
   calculating an abstractability of the design, the abstractability comprising the ratio of the first number of abstracted elements to the second number of original elements; and
   establishing a lower difficulty level if the abstractability is greater than an abstractability threshold; and
determining a design verifiability metric value from the property verifiability metric values of the set of properties, the design verifiability metric value representing a difficulty level of verifying the set of properties on the design.

10. Computer executable medium comprising logic for estimating the difficulty level of a verification problem, the logic operable to:
   receive input comprising a design and a set of properties, a property of the set of properties operable to be verified on the design;
   repeat the following for each property of the set of properties:
      perform a plurality of verification processes on the each property on the design by performing an automatic test pattern generation process on the design; and
      establish a property verifiability metric value for the each property in accordance with the verification processes by establishing a lower difficulty level if the runtime of the automatic test pattern generation process is less than a runtime threshold, the property verifiability metric value representing a difficulty level of verifying the each property on the design; and
   determine a design verifiability metric value from the property verifiability metric values of the set of properties, the design verifiability metric value representing a difficulty level of verifying the set of properties on the design.

11. The medium of claim 10, wherein:
   the design comprises a circuit design for a circuit; and
   the design verifiability metric value comprises a circuit verifiability metric value.

12. The medium of claim 10, wherein determining the design verifiability metric value further comprises:
   assigning a weight to each property of the set of properties;
   calculating a weighted average of the property verifiability metric values, a property verifiability metric value of a property weighted according to the weight assigned to the property; and
   generating the design verifiability metric value from the weighted average.

13. The medium of claim 10, wherein establishing the property verifiability metric value further comprises:
   establishing a passing property verifiability metric value for the property, the passing verifiability metric value representing the difficulty level of verifying the property assuming that the property passes.

14. The medium of claim 10, wherein:
   performing the plurality of verification processes on the each property on the design further comprises:
      performing a symbolic model checking process based on one or more binary decision diagrams on the design; and
   establishing the property verifiability metric value further comprises:
      calculating a rate of growth of the binary decision diagrams; and
      selecting a higher difficulty level if the rate of growth is greater than a rate of growth threshold.

15. The medium of claim 10, wherein:
   performing the plurality of verification processes on the each property on the design further comprises:
      performing a symbolic model checking process based on one or more binary decision diagrams on the design; and
   establishing the property verifiability metric value further comprises:
      calculating a transition relation size of the binary decision diagrams; and
      selecting a lower difficulty level if the transition relation size is lower than a transition relation size threshold.

16. Computer executable medium comprising logic for estimating the difficulty level of a verification problem, the logic operable to:
   receive input comprising a design and a set of properties, a property of the set of properties operable to be verified on the design;
   repeat the following for each property of the set of properties:
      perform a plurality of verification processes on the each property on the design, performing the plurality of verification processes on the each property on the design comprising:
         performing a bounded model checking process on the design;
      establish a property verifiability metric value for the each property in accordance with the verification processes, the property verifiability metric value representing a difficulty level of verifying the each property on the design, establishing the property verifiability metric value comprising:
         determining a rate of growth of a plurality of time frames of the bounded model checking process; and
         performing an abstraction process on the design if the rate is less than a rate threshold; and
   determine a design verifiability metric value from the property verifiability metric values of the set of properties, the design verifiability metric value representing a difficulty level of verifying the set of properties on the design.

17. Computer executable medium comprising logic for estimating the difficulty level of a verification problem, the logic operable to:
   receive input comprising a design and a set of properties, a property of the set of properties operable to be verified on the design;
   repeat the following for each property of the set of properties:
      perform a plurality of verification processes on the each property on the design, performing the plurality of verification processes on the each property on the design comprising:
         performing an abstraction process on the design to abstract out a first number of abstracted elements from the design comprising a second number of original elements to yield a third number of remaining elements;
      establish a property verifiability metric value for the each property in accordance with the verification processes, the property verifiability metric value representing a difficulty level of verifying the each property on the design, establishing the property verifiability metric value comprising:

establishing a higher difficulty level if the third number of remaining elements is greater than an remaining element threshold; and determine a design verifiability metric value from the property verifiability metric values of the set of properties, the design verifiability metric value representing a difficulty level of verifying the set of properties on the design.

18. Computer executable medium comprising logic for estimating the difficulty level of a verification problem, the logic operable to:

receive input comprising a design and a set of properties, a property of the set of properties operable to be verified on the design;

repeat the following for each property of the set of properties:

perform a plurality of verification processes on the each property on the design, performing the plurality of verification processes on the each property on the design comprising:

performing an abstraction process on the design to abstract out a first number of abstracted elements from the design comprising a second number of original elements to yield a third number of remaining elements;

establish a property verifiability metric value for the each property in accordance with the verification processes, the property verifiability metric value representing a difficulty level of verifying the each property on the design, establishing the property verifiability metric value comprising:

calculating an abstractability of the design, the abstractability comprising the ratio of the first number of abstracted elements to the second number of original elements; and establishing a lower difficulty level if the abstractability is greater than an abstractability threshold; and determine a design verifiability metric value from the property verifiability metric values of the set of properties, the design verifiability metric value representing a difficulty level of verifying the set of properties on the design.

19. A system for estimating the difficulty level of a verification problem, comprising:

means for receiving input comprising a design and a set of properties, a property of the set of properties operable to be verified on the design;

means for repeating the following for each property of the set of properties:

performing a plurality of verification processes on the each property on the design by performing an automatic test pattern generation process on the design;

establishing a property verifiability metric value for the each property in accordance with the verification processes by establishing a lower difficulty level if the runtime of the automatic test pattern generation process is less than a runtime threshold, the property verifiability metric value representing a difficulty level of verifying the each property on the design; and determining a design verifiability metric value from the property verifiability metric values of the set of properties, the design verifiability metric value representing a difficulty level of verifying the set of properties on the design.

20. A method for estimating the difficulty level of a verification problem, comprising:

receiving input comprising a design and a set of properties, the design comprising a circuit design for a circuit, a property of the set of properties operable to be verified on the design;

repeating the following for each property of the set of properties:

performing a plurality of verification processes on the each property on the design;

establishing a property verifiability metric value for the each property in accordance with the verification processes, the property verifiability metric value representing a difficulty level of verifying the each property on the design, establishing the property verifiability metric value further comprising:

establishing a passing property verifiability metric value for the property, the passing verifiability metric value representing the difficulty level of verifying the property assuming that the property passes; and determining a design verifiability metric value from the property verifiability metric values of the set of properties, the design verifiability metric value comprising a circuit verifiability metric value, the design verifiability metric value representing a difficulty level of verifying the set of properties on the design, determining the design verifiability metric value further comprising:

assigning a weight to each property of the set of properties;

calculating a weighted average of the property verifiability metric values, a property verifiability metric value of a property weighted according to the weight assigned to the property; and generating the design verifiability metric value from the weighted average, wherein:

performing the plurality of verification processes on the each property on the design further comprises:

performing an automatic test pattern generation process on the design;

establishing the property verifiability metric value further comprises:

establishing a lower difficulty level if the runtime of the automatic test pattern generation process is less than a runtime threshold;

performing the plurality of verification processes on the each property on the design further comprises:

performing a bounded model checking process on the design;

establishing the property verifiability metric value further comprises:

determining a rate of growth of a plurality of time frames of the bounded model checking process; and performing an abstraction process on the design if the rate is less than a rate threshold;

performing the plurality of verification processes on the each property on the design further comprises:

performing an abstraction process on the design to abstract out a first number of abstracted elements from the design comprising a second number of original elements to yield a third number of remaining elements;

establishing the property verifiability metric value further comprises:
  establishing a higher difficulty level if the third number of remaining elements is greater than an remaining element threshold;
performing the plurality of verification processes on the each property on the design further comprises:
  performing an abstraction process on the design to abstract out a first number of abstracted elements from the design comprising a second number of original elements to yield a third number of remaining elements;
establishing the property verifiability metric value further comprises:
  calculating an abstractability of the design, the abstractability comprising the ratio of the first number of abstracted elements to the second number of original elements; and
  establishing a lower difficulty level if the abstractability is greater than an abstractability threshold;
performing the plurality of verification processes on the each property on the design further comprises:
  performing a symbolic model checking process based on one or more binary decision diagrams on the design;
establishing the property verifiability metric value further comprises:
  calculating a rate of growth of the binary decision diagrams; and
  selecting a higher difficulty level if the rate of growth is greater than a rate of growth threshold;
performing the plurality of verification processes on the each property on the design further comprises:
  performing the symbolic model checking process based on one or more binary decision diagrams on the design; and
establishing the property verifiability metric value further comprises:
  calculating a transition relation size of the binary decision diagrams; and
  selecting a lower difficulty level if the transition relation size is lower than a transition relation size threshold.

* * * * *